(12) United States Patent
Fujita

(10) Patent No.: US 6,646,428 B2
(45) Date of Patent: Nov. 11, 2003

(54) SWEEP SYNCHRONIZATION TESTING

(75) Inventor: Kiyohisa Fujita, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/875,495

(22) Filed: Jun. 6, 2001

(65) Prior Publication Data

US 2002/0000799 A1 Jan. 3, 2002

(30) Foreign Application Priority Data

Jun. 29, 2000 (JP) ........................................ 2000-196135

(51) Int. Cl.[7] ........................ G01R 19/00; G01R 23/00
(52) U.S. Cl. ............................... 324/76.19; 324/76.11
(58) Field of Search ........................... 324/76.11–76.83; 702/72, 70, 68, 67

(56) References Cited

U.S. PATENT DOCUMENTS

| | | | |
|---|---|---|---|
| 3,681,706 A | 8/1972 | Harzer .................. 331/1 A |
| 4,476,462 A | 10/1984 | Feldman | |
| 4,476,531 A * | 10/1984 | Marino et al. .............. 324/379 |
| 4,559,952 A | 12/1985 | Angelsen et al. | |
| 4,561,049 A | 12/1985 | Deleganes et al. | |
| 4,650,014 A | 3/1987 | Oldendorf et al. | |
| 4,652,816 A | 3/1987 | Crookshanks | |
| 4,748,861 A | 6/1988 | Matsumoto et al. | |
| 4,764,915 A | 8/1988 | Efron et al. | |
| 4,809,189 A * | 2/1989 | Batson .................. 324/121 R |
| 4,890,236 A | 12/1989 | Kilk et al. | |
| 5,343,404 A * | 8/1994 | Girgis ........................ 324/623 |
| 5,617,523 A * | 4/1997 | Imazu et al. ................ 345/440 |
| 5,963,726 A * | 10/1999 | Rust et al. ..................... 703/13 |
| 6,210,168 B1 * | 4/2001 | Aiger et al. ................ 434/262 |
| 6,239,586 B1 * | 5/2001 | Fawcett et al. ............. 324/520 |
| 6,242,900 B1 * | 6/2001 | Fawcett et al. ............. 324/520 |

FOREIGN PATENT DOCUMENTS

| | | |
|---|---|---|
| EP | 0 335 729 A2 | 10/1989 |
| EP | 0 420 082 A2 | 4/1991 |
| JP | 61-249090 | 11/1986 |
| JP | 61-262668 | 11/1986 |
| JP | 61-276053 | 12/1986 |
| JP | 62-161193 | 7/1987 |

* cited by examiner

*Primary Examiner*—N. Le
*Assistant Examiner*—Jollin Teresinski
(74) *Attorney, Agent, or Firm*—Fish & Richardson P.C.

(57) ABSTRACT

Techniques for use in sweep synchronization test equipment include receiving a simulation setting and displaying a simulated result based on the simulation setting and previously-measured data. The equipment is switched to a measurement mode in response to user activity, and the simulation setting is used as a control setting. A new measurement is performed based on the control setting. The displayed simulated result is updated based on data obtained from the new measurement.

22 Claims, 3 Drawing Sheets

SWEEP SYNCHRONIZATION TESTING

TECHNICAL FIELD

The invention relates to an electric testing apparatus, and in particular, to sweep synchronization test equipment that can operate over a wide frequency range and establish a control setting value in a relatively short period of time.

BACKGROUND

In rest equipment such as spectrum analyzers, frequency and wavelength components of an input signal representative of a measured object may be limited to a range that is considerably narrower than the overall frequency range of the test equipment. It may be difficult for a user to identify such a limited frequency range and to obtain a satisfactory measurement result in a single operation. Typically, the user must repeatedly perform measurement operations using different ranges before obtaining a satisfactory measurement. Several hundred data sets or samples may be acquired, and a long duration (e.g., more than one minute) may be required for a single measurement operation.

Japanese Patent No. 2807709 discloses techniques for control setting operations. A first example relates to a method for displaying an expected value before execution of a measurement operation to assist adjustment of control settings of test equipment. The method includes (A) determining whether or not a user is adjusting control settings; (B) calculating an expected value at which data that have already measured are to be displayed based on the data and new control settings when the control settings are adjusted; and (C) displaying the expected value on a display.

The first example is illustrated by FIG. 4:

Step 40: Control settings (e.g., a sweep frequency range, a sweep time, or other factors) are set in order to measure a target waveform through use of test equipment. A determination is made by the user as to whether or not the measurement result indicated on the display is satisfactory. If the measurement result is not satisfactory, another measurement operation is performed using modified control settings. A determination is made as to whether or not control settings have been adjusted.

Step 42: If (in step 40) the user has adjusted control settings, an expected value for the next measurement operation is calculated from the immediately preceding measured data and newly-determined control settings. The calculated expected value is displayed.

Step 44: After the expected value is displayed (or where the control settings have not yet been adjusted), a new measurement operation is performed.

Step 46: The expected value appearing on the display is updated based on the newly measured data.

A second example includes (A) determining whether or not control settings are adjusted; (B) calculating an expected value at which previously-measured data is to be displayed on the basis of the data and new control settings when the control settings are adjusted; (C) inspecting whether or not an expected value arises in a predetermined range of the measured data as a result of adjusting the control settings; and (D) displaying the expected value when the expected value is not limited by the measured data. An expected value is continuously displayed during an adjustment operation or before execution of a new measurement operation.

The second example is illustrated by FIG. 5:

Step 50: Control settings (e.g., a sweep frequency range, a sweep time, or other factors) are set to measure a target waveform through use of test equipment. A determination is made as to whether or not the measurement result indicated on the display is satisfactory. If the measurement result is not satisfactory, the user performs another measurement operation using modified control settings. A determination is made as to whether or not control settings have been adjusted.

Step 52: If (in step 50) the user has adjusted control settings, an expected value for the next measurement operation is calculated from the immediately preceding measured data and newly-determined control settings. The expected value is displayed.

Step 54: After calculating the expected value, a determination is made as to whether or not the expected value falls within a desired range of immediately preceding measured data.

Step 56: If (in step 50) the control settings have not been adjusted or the expected value is determined to fall within the predetermined range of the immediately preceding measured data in step 54, a new measurement operation is performed.

Step 58: The expected value appearing on the display is updated with reference to newly measured data.

As mentioned above, the test equipment can require a significant amount of time to perform a sweep measurement operation. However, the expected value calculated from the immediately-preceding measured data and new control settings can be quickly displayed before a measurement result is obtained based on the adjusted control settings. When the user adjusts control settings, an approximation can be displayed quickly, thereby improving work efficiency. However, a new measurement is performed by the test equipment even when the calculated expected value is not satisfactory because calculation of an expected value and adjustment of control settings for a new measurement are performed simultaneously.

BRIEF DESCRIPTION OF THE DRAWINGS

FIGS. 3-1 through 3-4 are graphs showing measurement results according to the present invention.

FIGS. 4 and 5 are flowcharts of known methods.

SUMMARY

In general, techniques for use in sweep synchronization test equipment includes receiving a simulation setting and displaying a simulated result based on the simulation setting and previously-measured data. The equipment is switched to a measurement mode in response to user activity, and the simulation setting is used as a control setting. A new measurement is performed based on the control setting. The displayed simulated result is updated based on data obtained from the new measurement.

Test equipment implementing the technique also is disclosed.

One or more of the following features may be included in some implementations. The steps of receiving a simulation setting and displaying a simulated result based on the simulation setting and previously-measured data can be performed repeatedly before switching to the measurement mode.

The simulated result can be calculated after detecting a change in the simulation setting. Alternatively, the simulated result can repeatedly be calculated and re-displayed while the equipment is operating in a simulation mode regardless of whether a change in the simulation setting is detected. Receiving the simulation setting can include receiving a center wavelength and a span. In some cases, receiving a simulation setting can include receiving multiple center wavelengths.

Switching to the measurement mode can occur in response to user activity other than adjusting the simulation setting.

Some implementations may include one or more of the following advantages. Because changes to the simulation setting do not affect a change in the parameters used for a subsequent measurement unless and until the user causes the test equipment to operate in the measurement mode, an optimal control setting for the test equipment can be established more quickly.

Additional features and advantages will be readily apparent from the following detailed description, accompanying drawings and the claims.

DETAILED DESCRIPTION

Figure 1:
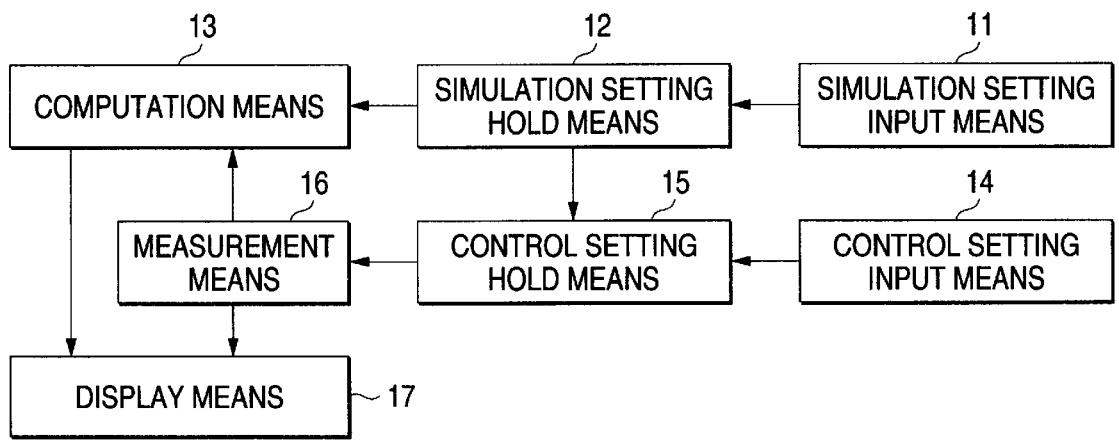
FIG. 1 is a block diagram showing a configuration of sweep synchronization test equipment according to the present invention.

As shown in FIG. 1, sweep synchronization test equipment includes means 11 for entering simulation data and memory 12 for storing the simulation setting data. The means 11 for entering the simulation data can include, for example, a keyboard, a knob, a button, a pointing device such as a mouse, or a touch screen. The equipment includes means 13 for calculating a simulation result based on the simulation setting and previously-measured data. The means for calculating 13 can include a processor. The equipment also includes a display monitor or other display screen 17 for displaying the simulation result and means 14 for establishing the simulation setting as a control setting. The means 14 for establishing can include a keyboard, a knob, a button, a pointing device such as a mouse, or a touch screen, and can cause the simulation setting to be copied as a control setting that is stored in memory 15. Circuitry 16 is provided to perform a measurement operation based on the control setting. The processor then updates the display based on the measured data the control setting.

The synchronization test equipment can sweep over a desired frequency range and can operate in a measurement mode or a simulation mode. In the measurement mode, the test equipment applies test signals and makes measurements using a range of signals whose characteristics are set by a user. The results of the measurements are displayed. The simulation mode allows estimates of measurements to be displayed. When operated in the simulation mode, the test equipment makes an estimate of a hypothetical measurement based on previously-measured data and the current state of the simulation settings. Changes to the simulation settings do not affect a change in the parameters used for a subsequent measurement unless and until the user actuates the means 14 (e.g., by pressing a button) to cause the test equipment to operate in the measurement mode, thereby causing the simulation settings to be copied as control settings.

Figure 2:
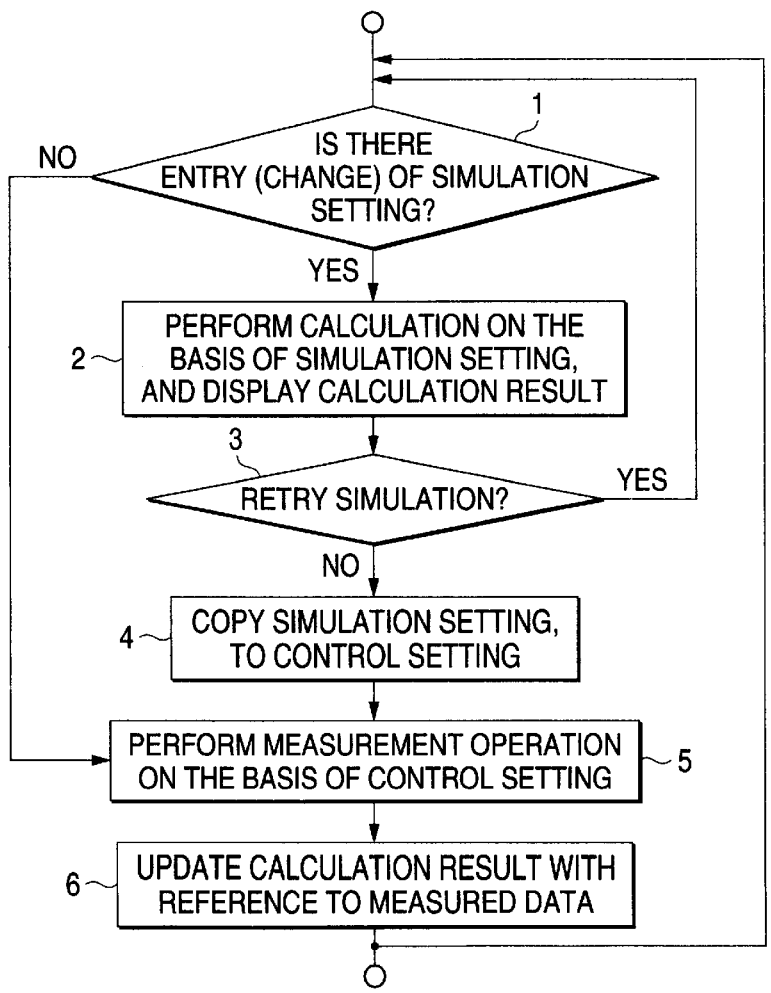
FIG. 2 is a flowchart of a method of operation of sweep synchronization test equipment according to the present invention.

In one implementation, as shown in FIG. 2, operation of the sweep synchronization test equipment includes the following:

Step 1: When a measured value appearing on the display is not satisfactory (for example, a target frequency range should be displayed in more detail), simulation settings can be entered. A determination is made as to whether or not simulation settings have been entered by the user.

Step 2: When simulation settings are entered, an approximation is calculated from an immediately preceding measured value and the new simulation settings. Since the settings are for the purpose of simulation, an actual measurement operation is not performed at this time. The calculated approximation is displayed.

Step 3: A determination is made at to whether or not the user performs a simulation based on new settings while viewing the calculated result. If another simulation is performed, processing returns to step 2. If the user does not desire to perform another simulation, the user causes the test equipment to enter the measurement mode. The simulation settings are copied as control settings for the purpose of obtaining an actual measurement.

Step 4: A measurement operation is performed on the basis of the control settings.

Step 5: The displayed calculated result is updated using the result of the measurement performed in step 4.

Figures 1, 3:
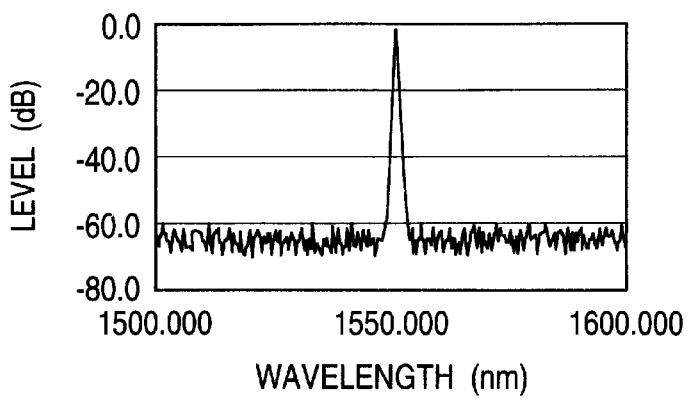
Figures 2, 3:
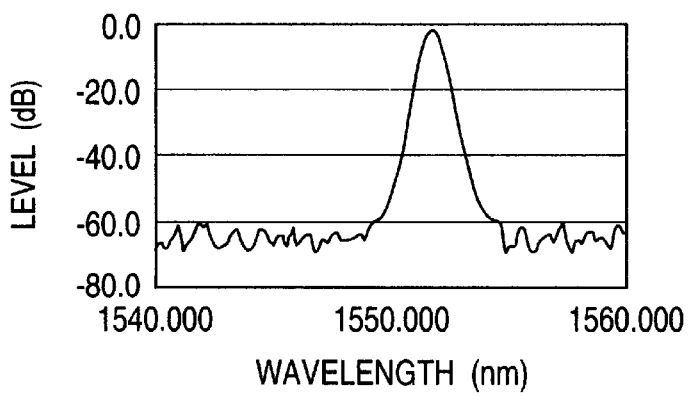
Figure 3:
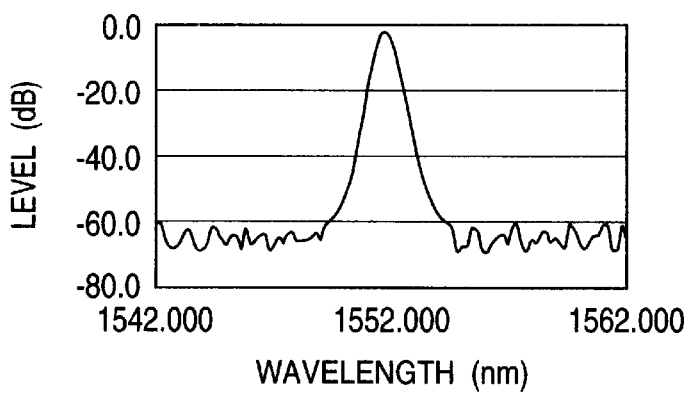
Figures 3, 4:
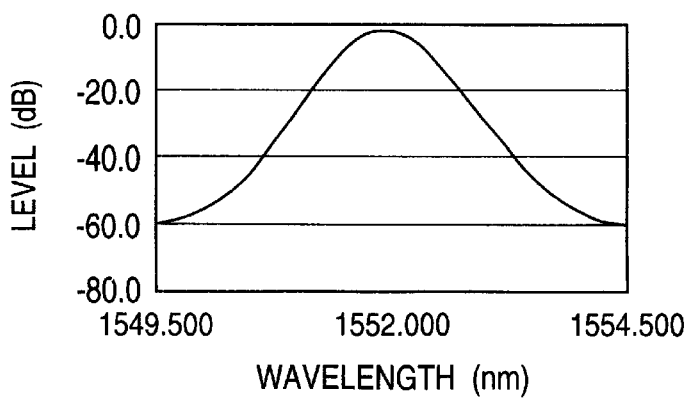
Figure 4:
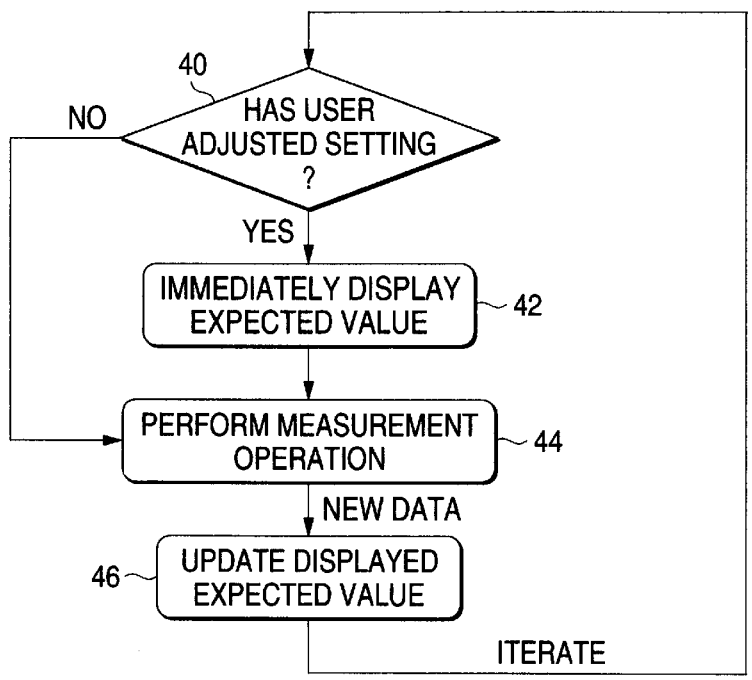
Figure 5:
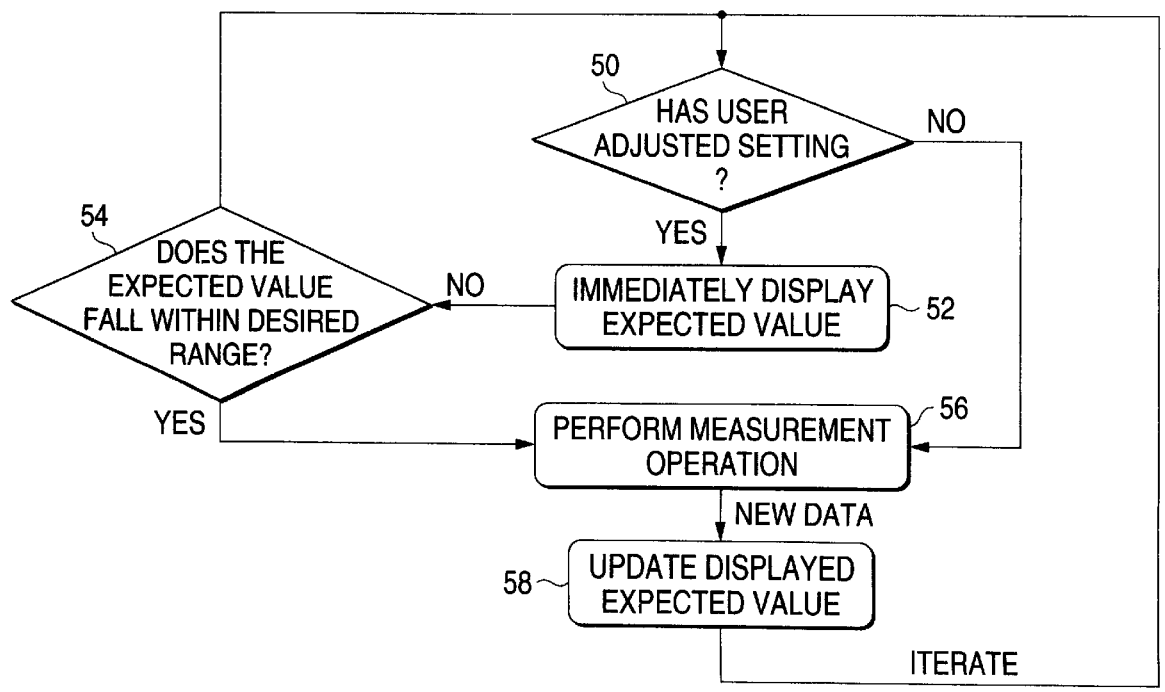

FIGS. 3-1 through 3-4 illustrate measurement results on a display. The horizontal axis represents wavelengths in nanometers (nm), and the vertical axis represents measured levels of respective waveforms in decibels (dB).

FIG. 3-1 shows measurement results which were obtained on the basis of control settings (a center wavelength of 1550 nm, a wavelength range of 1500 to 1600, and a span of 100 nm) employed at the beginning of the measurement operation. A display resolution assumes a value of 100 nm/500 dots=0.2 nm/dot, and a data sampling interval is 100 nm/500 points=0.2 nm/point.

From the measurement result, the user can ascertain that a characteristic wavelength component is present in the vicinity of 1550 nm. The user enters a value (e.g., a span of 20 nm) as a simulation setting (step 1).

A calculation is performed based on the simulation setting and the measured data shown in FIG. 3-1. Based on the calculated result, an enlarged view of a predetermined wavelength area of the wavelength shown in FIG. 3-1 is displayed, as shown in FIG. 3-2. In this case, a display resolution of 20 nm/500 dots=0.04 nm/dot is achieved. The data sampling interval remains unchanged. Therefore, the sampling interval is 100 nm/500 points=0.2 nm/point (step 2).

From the simulated result, the user can determine that the center wavelength is slightly deviated from a center wavelength of 1550 nm currently indicated on the display. If the user changes the simulation setting to a center wavelength of 1552 nm, a calculation is performed based on the changed simulation setting and the measured data shown in FIG. 3-1. On the basis of the calculated result, an enlarged view of the predetermined wavelength area of the wavelength shown in FIG. 3-1 is displayed, as shown in FIG. 3-3. In this case, a display resolution of 20 nm/500 dots=0.04 nm/dot is achieved, and the data sampling interval remains unchanged. Therefore, the sampling interval is 100 nm/500 points=0.2 nm/point (step 3).

From the simulated result shown in FIG. 3-3, the user can predict that the center wavelength is in the vicinity of 1552 nm as indicated on the display. The simulation setting is changed to a span of 5 nm centered on a wavelength of 1552 nm. A calculation is performed based on the changed simulation setting, and the measured data shown in FIG. 3-1. On the basis of the calculated result, an enlarged view of a predetermined wavelength area of the wavelength shown in FIG. 3-1 is displayed, as shown in FIG. 3-4. In this case, a display resolution of 5 nm/500 dots=0.01 nm/dot is achieved, and the data sampling interval remains unchanged. Therefore, the sampling interval is 100 nm/500 points=0.2 nm/point (step 3).

From the displayed simulated result, the user can predict that the waveform shown in FIG. 3-4 represents a characteristic portion of a target signal. The current simulation setting is copied as a control setting to be used for performing a measurement operation (step 4). The target signal is measured based on the control setting, (step 5), and the display is updated using the resulting measured data (step 6).

Using the foregoing technique, a user can predict a desired frequency range by trial-and-error. Calculations are performed based on previously-measured data and a simulation setting without the need to repeatedly make actual measurements of a characteristic portion of the target signal. Instead, the calculations can be made based on a first measurement result that corresponds to a wide wavelength range as shown on the display. A selected simulation setting is copied to a control setting to be used for actually measuring the target signal. Thus, a target signal in a desired frequency range can be measured readily without the need to perform repeated measurement operations that may be time-consuming.

At the time of the initial measurement operation, if a wide frequency range and a measurement span (i.e., a sampling frequency) are selected for the control setting, a target value can be measured in less time.

In an alternative implementation, when the test equipment is operated in the simulation mode, the image appearing on the display is continuously and regularly updated based on the state of the simulation settings and based on the previously-measured data regardless of whether or not the user is adjusting the simulation settings. In that case, the test equipment cycles through the steps of retrieving the current state of the simulation settings and retrieving the previously-measured data to update the image on the display regardless of whether the user is adjusting the simulation settings.

The techniques can assist a user in establishing an optimal control setting for the test equipment. The range of measured wavelength corresponding to a characteristic of a target signal can be determined within a short period of time by performing a calculation based on immediately preceding measured data and the simulation setting, without requiring a corresponding change to the control setting.

In some situations, the steps of entering a simulation setting and displaying a simulation result calculated from the simulation setting and the measured data may be repeated one or more times. If the sampling interval used for making the initial data measurement is longer than an ordinary time interval, first measured data to be used for a simulation can be obtained in a shorter time.

Multiple center wavelengths can be entered as the simulation setting. Even when a target signal includes multiple center wavelengths, a more optimal measurement wavelength range can be determined. In other cases, a center wavelength and a span can be set as the simulation setting.

Various features of the test equipment can be implemented in hardware, software, or a combination of hardware and software. For example, some aspects of the equipment can be implemented in computer programs executing on programmable computers. Each program can be implemented in a high level procedural or object-oriented programming language to communicate with a computer system. Furthermore, each such computer program can be stored on a storage medium, such as read-only-memory (ROM) readable by a general or special purpose programmable computer, for configuring and operating the computer when the storage medium is read by the computer to perform the functions described above.

Other implementations are within the scope of the claims.

What is claimed is:

1. A method for use in sweep synchronization test equipment, the method comprising:

receiving a simulation setting;

displaying a simulated result based on the simulation setting and previously-measured data;

switching to a measurement mode in response to user activity, and using the simulation setting as a control setting only after switching to the measurement mode;

performing a new measurement based on the control setting; and updating the displayed simulated result based on data obtained from the new measurement.

2. The method of claim 1 including repeatedly receiving a simulation setting and displaying a simulated result based on the simulation setting and previously-measured data before switching to the measurement mode.

3. The method of claim 2 including calculating the simulated result after detecting a change in the simulation setting.

4. The method of claim 2 including repeatedly calculating and re-displaying the simulated result while operating in a simulation mode regardless of whether a change in the simulation setting is detected.

5. The method of claim 1 wherein receiving the simulation setting includes receiving a center wavelength and a span.

6. The method of claim 1 wherein receiving a simulation setting includes receiving a plurality of center wavelengths.

7. The method of claim 1 wherein switching to the measurement mode occurs in response to user activity other than adjusting the simulation setting.

8. The method of claim 1 including repeatedly receiving a simulation setting and displaying a simulated result based on the simulation setting and previously-measured data before switching to the measurement mode, wherein switching to the measurement mode occurs in response to user activity other than adjusting the simulation setting.

9. The method of claim 8 wherein receiving the simulation setting includes receiving a center wavelength and a span.

10. The method of claim 8 wherein receiving a simulation setting includes receiving a plurality of center wavelengths.

11. An article comprising a computer-readable medium which stores computer-executable instructions for causing a computer system to:

display, in response to receiving a simulation setting, a simulated result based on the simulation setting and previously-measured data;

switch to a measurement made in response to user activity, and use the simulation setting as a control setting only after switching to the measurement mode;

perform a new measurement based on the control setting; and update the displayed simulated result based on data obtained from the new measurement.

12. The article of claim 11 including instructions for causing the computer system to repeatedly display simulated results in response to receiving simulation settings while operating in a simulation mode, the simulated results being based on the simulation settings and previously-measured data.

13. The article of claim 12 including instructions for causing the computer system to calculate a simulated result after detecting a change in a simulation setting.

14. The article of claim 12 including instructions for causing the computer system to repeatedly calculate and re-display a simulated result while operating in a simulation mode regardless of whether a change in the simulation setting is detected.

15. The article of claim 11 including instructions for causing the computer system to switch to the measurement mode in response to user activity other than adjusting the simulation setting.

16. The article of claim 11 including instructions for causing the computer system to:

repeatedly display simulated results in response to receiving simulation settings while operating in a simulation mode, the simulated results being based on the simulation settings and previously-measured data; and switch to the measurement mode in response to user activity other than adjusting a simulation setting.

17. Test equipment comprising:

first means for entering a simulation setting;

second means for causing the test equipment to switch between a simulation mode to a measurement mode;

circuitry for making a measurement;

a display; and a processor configured to:

display on the display, in response to receiving a simulation setting through the first means, a simulated result based on the simulation setting and previously-measured data;

switch to the measurement mode, in response to activation of the second means, and use the simulation setting as a control setting only after switching to the measurement mode;

perform a new measurement based on the control setting using the circuitry; and update the simulated result on the display based on data obtained from the new measurement.

18. The test equipment of claim 17 wherein the processor is configured to repeatedly display simulated results on the display in response to receiving simulation settings while operating in a simulation mode, the simulated results being based on the simulation settings and previously-measured data.

19. The test equipment of claim 18 wherein the processor is configured to calculate a simulated result after detecting a change in a simulation setting.

20. The test equipment of claim 18 wherein the processor is configured to repeatedly calculate and re-display a simulated result on the display while operating in a simulation mode regardless of whether a change in the simulation setting is detected.

21. The test equipment of claim 17 wherein the processor is configured to switch to the measurement mode in response to user activity with respect to the second means.

22. The test equipment of claim 17 wherein the processor in configured to:

repeatedly display simulated results in response to receiving simulation settings while operating in a simulation mode, the simulated results being based on the simulation settings and previously-measured data; and switch to the measurement mode in response to user activity with respect to the second means.

* * * * *